United States Patent [19]

Crafts et al.

[11] Patent Number: 4,866,567
[45] Date of Patent: Sep. 12, 1989

[54] HIGH FREQUENCY INTEGRATED CIRCUIT CHANNEL CAPACITOR

[75] Inventors: Harold S. Crafts; Mark Q. Scaggs, both of Fort Collins, Colo.

[73] Assignee: NCR Corporation, Dayton, Ohio

[21] Appl. No.: 294,154

[22] Filed: Jan. 6, 1989

[51] Int. Cl.⁴ .......................... H01I 5/06; H01L 27/02
[52] U.S. Cl. ...................................... 361/311; 357/51
[58] Field of Search ................... 357/51, 14, 15, 23.3, 357/44; 307/458, 465, 475; 361/311–313

[56] References Cited

U.S. PATENT DOCUMENTS

| | | | |
|---|---|---|---|
| 3,860,945 | 1/1975 | Dawson | 357/14 |
| 4,163,245 | 7/1979 | Kinoshita | 357/51 |
| 4,416,049 | 11/1983 | McElroy | 357/51 X |
| 4,595,942 | 6/1986 | Lohstroh | 357/44 |
| 4,772,930 | 9/1988 | Anami et al. | 357/44 X |

Primary Examiner—Donald A. Griffin
Attorney, Agent, or Firm—Wilbert Hawk, Jr.; Casimer K. Salys

[57] ABSTRACT

A high frequency integrated circuit channel capacitor structure comprised of interdigitated field effect transistor gate electrodes and source/drain regions of minimum dimension and respective common connection. The multiplicity of parallel connected capacitive regions between the polysilicon gate electrode and a channel region in the substrate provide precisely controlled capacitors with exceptionally low resistance. Metallization contacts to the gate polysilicon and source/drain regions at each interleaved pattern, together with minimum channel length dimensions, minimizes the capacitive resistance. A CMOS configuration is also feasible.

8 Claims, 2 Drawing Sheets

HIGH FREQUENCY INTEGRATED CIRCUIT CHANNEL CAPACITOR

BACKGROUND OF THE INVENTION

The present invention generally relates to an integrated circuit structure, and more particularly to a structure for forming integrated circuit channel capacitors suitable for a high frequency operation.

A variety of integrated circuit capacitor structures have been developed over the years. Very often the structures which create the capacitors are intimately related to the integrated circuit fabrication process, to the effect that capacitor structures vary considerably. For example, U.S. Pat. No. 4,419,812 teaches a capacitor structure employing two parallel plate layers of consecutively formed polysilicon, requiring a two polysilicon layer fabrication process. Functional constraints are also common for prior art configurations. For example, U.S. Pat. Nos. 3,860,945 teaches the structure of an integrated circuit capacitor produced by a reverse biased p-n junction in a refined epitaxial configuration. The structure of an integrated circuit capacitor formed between a dielectrically isolated electrode as one terminal and a heavily doped substrate region as the second terminal is described in U.S. Pat. No. 4,156,249. In that case, the effective area of the capacitor plate formed by the heavily doped substrate electrode is varied by laterally disposed and dimensionally modifiable depletion regions.

In the presence of such prior art, there exists a need for an integrated circuit capacitor which is able to utilize the minimum design rules of field effect transistor gate structures and the minimum design rules of semiconductor diffusions to create low resistivity capacitor regions suitable for high frequency applications.

SUMMARY OF THE INVENTION

A high frequency integrated circuit channel capacitor structure is shown and described to include a multiplicity of commonly connected minimum design rule field effect gate electrode regions interdigitated with minimum design rule source/drain diffusion regions. The minimum length channel defined by each gate electrode provides, when biased above the transistor threshold, a channel region and associated effective channel capacitor between the gate electrode and the node represented by the source/drain regions. Interdigitated disposition of the gate electrodes using minimum channel length gate electrodes, with channel regions having width/length ratios significantly in excess of 10, produces channel capacitors with exceptionally low resistivity and exceptionally high capacitance per unit area of substrate.

Capacitors formed from an electrically common polysilicon layer and complementary but electrically common source/drain regions in a CMOS application provide high frequency capability over the full range of the power supply, without threshold range disablements, but at the expense of a nominal 2:1 capacitance variation at voltage extremes.

These and other features of the present invention will be more clearly understood and appreciated upon considering the detailed embodiments described hereinafter.

DESCRIPTION OF THE PREFERRED EMBODIMENT

Figure 1:
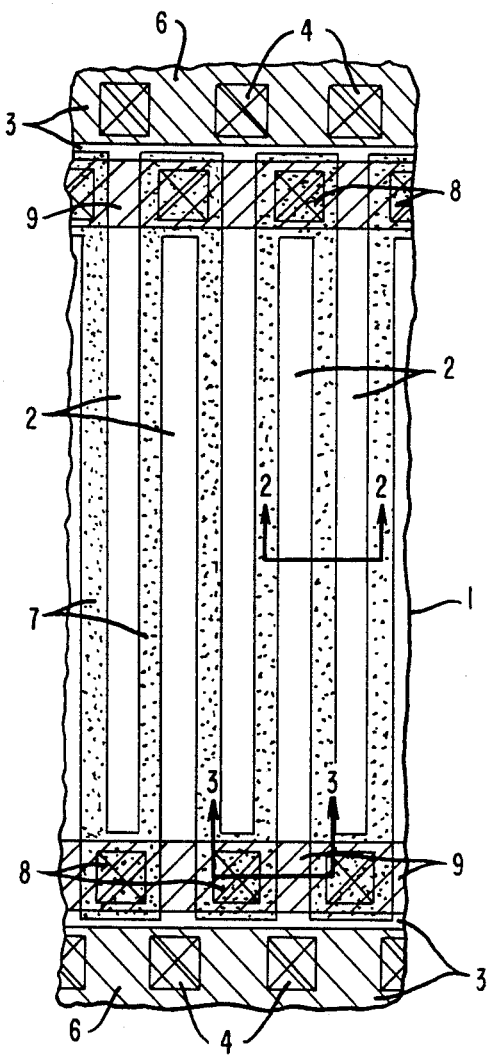
FIG. 1 is a schematic top view of an integrated circuit pattern for creating high frequency channel capacitor.
Figure 2:
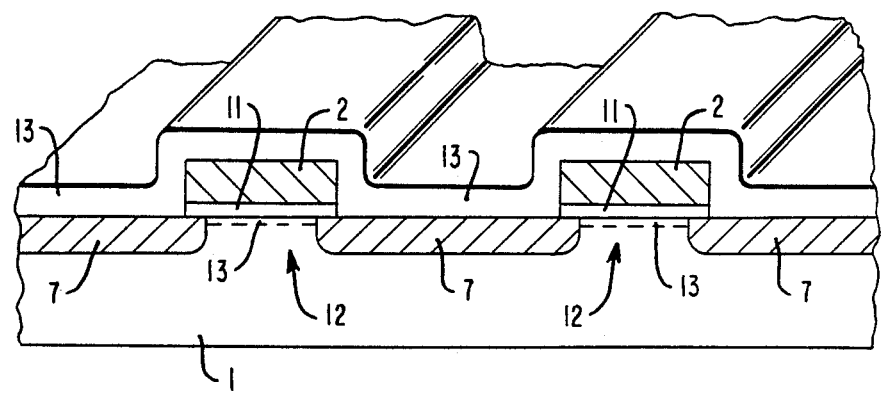
FIGS. 2 and 3 are a schematic cross section of the layout depicted in FIG. 1.
Figure 3:
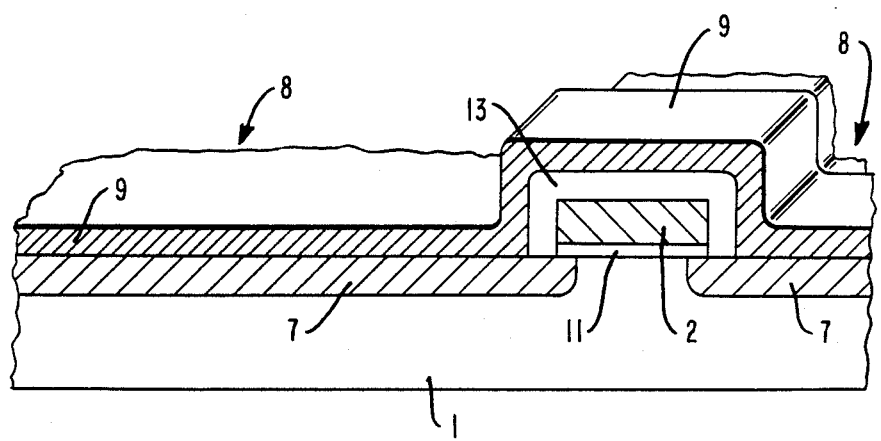

FIG. 1 presents a top view of a region from semiconductor substrate 1, the structure being further illustrated by selective cross sections in FIGS. 2 and 3. As shown in FIG. 2, multiple interdigitated polysilicon gate electrode structures 2 extend into a central region from commonly connected and laterally disposed first polysilicon layer regions 3. The first polysilicon layer regions 3 are connected through a multiplicity of polysilicon contacts 4 to a low resistance metallization layer 6, shown by cross-hatching. The view in FIG. 1 also shows a multiplicity of interdigitated source/drain diffusions 7 between the successive polysilicon electrodes 2. The heavily doped diffusions of first impurity type are formed into substrate 1 of lightly doped second impurity type and are ohmically and commonly connected at opposite ends through contacts 8 to overlying low resistance metallization line 9, also shown by cross-hatching.

A cross section of the structure depicted in FIG. 1 is shown in FIG. 2, for the partial section defined by 2—2. The cross section in FIG. 2 schematically illustrates that polysilicon electrodes 2 are separated by a gate dielectric 11 from channel regions 12 in substrate 1, and are generally situated between successive source/drain diffusion regions 7. Note the similarity to a field effect transistor. This structural similarity is intentional, given the objective of creating channel capacitors in regions 12. Whenever the potential on gate electrodes 2 is sufficient to invert and create channel regions 13 in substrate 1, such channel regions 13 become capacitor plate type electrical extensions of source/drain diffusion regions 7.

FIG. 3 schematically illustrates a partial cross section along 3—3 in FIG. 1. Contacts 8 and low resistance metallization layer 9 are shown electrically connecting the successive source/drain diffusion regions 7 to form in parallel, and in common, one electrode of the capacitor as represented by the node of metallization 9. The capacitor in FIG. 2 has, as its second plate, the multiplicity of commonly and parallel connected first polysilicon layer electrodes 2. The capacitor dielectric is the gate dielectric 11, typically of silicon dioxide composition.

Given that one electrode of the capacitor is defined by channel 13, a capacitor of this structure becomes active only when the potential of the polysilicon electrode 2 exceeds the threshold of the effective field effect transistor, namely, when lightly doped substrate 1 in channel region 13 is inverted and made electrically common to source/drain diffusion region 7. A typical threshold voltage is 0.7 volts.

The channel capacitors of the present form are fully compatible and preferably used with CMOS integrated circuits. For CMOS applications, complementary n-channel and p-channel capacitor structures are configured and interconnected to have the gate polysilicon electrodes common and the source/drain diffusion electrodes common. For such parallel configured structures, the effective capacitance is substantially equal to the sum of the contributions of each channel capacitor region until the voltage on electrode 2 approaches within one threshold of the power supply limits. Thereafter, one half/side of the composite complementary capacitor structure becomes disabled while the other remains active. Therefore, the present capacitor structure is suitable for CMOS applications with the recognition that the capacitive value will decrease, but not completely cease, near the extremes of the power supply.

There are a number of benefits associated with the channel capacitor of the present design. First, the channel capacitor may be formed as an integral part of a field effect transistor fabrication operation. Preferably, such fabrication would be practiced in the course of forming the base set of a gate array integrated circuit product. As a second point, the use of a field effect device capacitor structure permits the designer to invoke the highly refined design tools and fabrication experiences developed from the making of precise field effect transistors. For example, fabricators of integrated circuits routinely control channel lengths very accurately through the precise formation of polysilicon layer 2 patterns. Likewise, the dimensional and electrical parameters of the dielectric 11 benefit from the prevailing level of experience in gate dielectric formation possessed by most semiconductor manufacturers.

The intrinsic low resistivity of the present channel capacitor structure can also be attributed to ways from the knowledge acquired in the development of field effect transistors. Minimal channel length and resistance design rules are directly applicable to the channel length defined by polysilicon 2. Similar minimum diffusion dimension experience is applicable in the formation of precision low resistance source/drain type diffusion regions 7. The capacitive resistivity is even further depressed by the fact that each channel region 13 capacitor plate is bounded by two source/drain regions of equal potential.

The use of minimum polysilicon and source/drain diffusion geometries to define the present channel capacitor does not constrain the structure to capacitors of small value. As evidenced in FIG. 1, the magnitude of the capacitance is equal to the sum of each polysilicon gate electrode region channel capacitor. The interdigitated polysilicon pattern, and serpentine-like diffusion pattern separating such polysilicon pattern, provides a composite channel capacitor structure of exceptionally low resistance and of correspondingly high operating frequency capability.

It will be understood by those skilled in the art that the embodiments set forth hereinbefore are merely exemplary of the numerous arrangements by which the invention may be practiced, and as such may be replaced by equivalents without departing from the invention which is now defines by the appended claims.

We claim:

1. A high frequency integrated circuit channel capacitor, comprising:
   1 a first lightly doped semiconductor substrate region of first conductivity type;
   a multiplicity of electrically common connected field effect first gate electrodes separated by gate dielectric from underlying channel regions defined in the first semiconductor substrate, forming a first electrode of the capacitor; and
   a multiplicity of commonly connected source/drain diffused regions of second conductivity type in the semiconductor substrate individually located between successive first gate electrode channel regions, forming a second electrode of the capacitor.

2. The apparatus recited in claim 1, wherein the first gate electrodes define thereunder channels of minimum dimension.

3. The apparatus recited in claim 2, wherein the diffused regions between successive first gate electrode channel regions are of minimum dimension.

4. The apparatus recited in claim 3, wherein the first gate electrodes are composed of doped polysilicon, are interdigitated in structure, and have channel regions with a width/length ration in excess of 10.

5. The apparatus recited in claim 1, further including:
   a second lightly doped semiconductor substrate region of second conductivity type;
   a multiplicity of commonly connected field effect second gate electrodes separated by gate dielectric from underlying channel regions defined in the second substrate region, forming a further part of the first electrode of the capacitor; and
   a multiplicity of commonly connected source/drain diffused regions of first conductivity type in the semiconductor substrate of second conductivity type individually located between successive second gate electrode channel regions, forming a further part of the second electrode of the capacitor.

6. The apparatus recited in claim 5, wherein the second gate electrodes define thereunder channels of minimum dimension.

7. The apparatus recited in claim 6, wherein the diffused regions between corresponding successive gate electrode channel regions are of minimum dimension.

8. The apparatus recited in claim 7, wherein the gate electrodes are composed of doped polysilicon, are correspondingly interdigitated in structure, and have channel regions with a width/length ration in excess of 10.

* * * * *

UNITED STATES PATENT AND TRADEMARK OFFICE
CERTIFICATE OF CORRECTION

PATENT NO. : 4,866,567

DATED : September 12, 1989

INVENTOR(S) : Harold S. Crafts et al.

It is certified that error appears in the above-identified patent and that said Letters Patent is hereby corrected as shown below:

Column 4, line 13, delete "commonly", insert --electrically common--.

Column 4, line 27, delete "ration", insert --ratio--.

Column 4, line 52, delete "ration", insert --ratio--.

Signed and Sealed this

Eleventh Day of September, 1990

Attest:

HARRY F. MANBECK, JR.

Attesting Officer

Commissioner of Patents and Trademarks